United States Patent
Igarashi

(10) Patent No.: US 6,720,626 B1
(45) Date of Patent: Apr. 13, 2004

(54) SEMICONDUCTOR DEVICE HAVING IMPROVED GATE STRUCTURE

(75) Inventor: Motoshige Igarashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/115,250

(22) Filed: Jul. 14, 1998

(30) Foreign Application Priority Data

Jan. 26, 1998 (JP) .......................................... 10-012560

(51) Int. Cl.$^7$ ....................... H01L 29/76; H01L 31/062; H01L 31/113; H01L 31/119
(52) U.S. Cl. .................. 257/368; 257/408; 257/384
(58) Field of Search ................ 257/2, 52, 57, 257/61, 368, 64, 66, 382–413

(56) References Cited

U.S. PATENT DOCUMENTS

| | | | | |
|---|---|---|---|---|
| 4,688,078 A | * | 8/1987 | Hseih | ......................... 257/316 |
| 4,742,491 A | * | 5/1988 | Liang et al. | ................. 365/218 |
| 5,172,196 A | * | 12/1992 | Matsukawa et al. | ........ 257/316 |
| 5,290,727 A | * | 3/1994 | Jain et al. | ................... 438/257 |
| 5,866,930 A | * | 2/1999 | Saida et al. | .................... 257/52 |

FOREIGN PATENT DOCUMENTS

| | | |
|---|---|---|
| JP | 63-261754 | 10/1988 |
| JP | 4-25176 | 1/1992 |
| JP | 9-64209 | 3/1997 |

* cited by examiner

Primary Examiner—Cuong Nguyen
(74) Attorney, Agent, or Firm—McDermott, Will & Emery

(57) ABSTRACT

A gate insulating film is formed on a semiconductor substrate, and a gate electrode is formed by deposition of semiconductor material on the gate insulating film. An amorphous layer is then formed along the surface of or inside the gate electrode, and side walls are formed on the gate electrode. Finally, impurities are implanted into the semiconductor substrate by ion implantation while the gate electrode and the side walls are used as masks.

1 Claim, 7 Drawing Sheets

SEMICONDUCTOR DEVICE HAVING IMPROVED GATE STRUCTURE

BACKGROUND OF THE INVENTION

1. Field of the Invention

The present invention relates to a method of manufacturing a semiconductor device and a semiconductor device manufactured by the method, and more particularly, to a method of manufacturing a semiconductor device including a MOS transistor, as well as to the structure of a gate electrode of the semiconductor device.

2. Background Art

As the channel length of a MOS transistor is decreased, the aspect ratio of a gate electrode is increased. To solve such a problem of an increase in the aspect ratio, there is a demand for a further reduction in the thickness of a thin film of electrode material. In contrast, there is a typical demand for the gate electrode possessing the masking properties (i.e., blocking properties) with respect to ionizing radiation with a view to maintaining fixed impurity concentrations of a channel region, imposing limitation on the reduction in the film thickness.

FIGS. 14 through 16 are perspective views for explaining an existing method of manufacturing a semiconductor device.

FIG. 14 shows the structure of a semiconductor device comprising a semiconductor substrate 1 having a gate insulating film 2 formed thereon and a gate electrode 3 formed on the gate insulating film 2. The electrode shown in the drawing is formed from commonly-used polysilicon (Poly-Si) doped with phosphorous. In the case of a MOS transistor having an LDD layer, patterning of the gate electrode 3 is followed by ion-implantation of an impurity layer into the semiconductor substrate 1, thereby forming an LDD layer 5.

FIG. 15 shows a gate electrode 3 immediately after a film 6 used for forming side walls has been deposited on the gate electrode 3. In this case, the film 6 has a two-layer structure comprising a TEOS film 7 and a SiN film 8. The polysilicon included in the gate electrode 3 is increased immensely in grain size through heat treatment during the manufacturing process, and impurity deposition layers C are formed along grain boundaries B. In the case of a polysilicon electrode doped with a particularly high concentration of impurities, there is a noticeable tendency to form impurity deposition layers.

FIG. 16 shows the semiconductor substrate after side walls 9 have been formed. Since the impurity deposition layers C are etched away faster than a silicon monocrystal, the exposed portions of the impurity deposition layers C in the upper surface of the gate electrode 3 are slightly taken away along the grain boundaries B when the film 6 is anisotropically etched away. Such erosion of the impurity deposition layers will be hereinafter referred to as a "local-removal phenomenon."

FIG. 17 shows a transistor, wherein a source/drain region (S/D) 10 is formed by ion-implantation of impurities into the semiconductor substrate 1 while the gate electrode 3 and the side walls 9 are used as masks. The exposed impurity deposition layers in the gate electrode 3 change to material which is liable to cause a channeling phenomenon at the time of ionizing radiation. Since such a deposition layer exists in the gate electrode 3 in the heightwise direction thereof, the masking properties of the gate electrode 3 are locally deteriorated. Such a phenomenon will be hereinafter referred to as a "channeling phenomenon." Further, locally-removed areas are more liable to cause the channeling phenomenon.

The influence of local removal or channeling phenomenon mentioned previously on the characteristics of the semiconductor device accounts for a deterioration in the reliability of the gate insulating film. One of the variations in the characteristics of a short-channel transistor is an increase in an off-leakage current. In this phenomenon, the concentration of the channel region is partially changed as a result of channeling of impurities along impurity deposition layers, thereby resulting in an increase in a source/drain leakage current flowing through the areas of the channel region whose concentrations are changed.

In the short-channel transistor, since a gate length approximates to a grain size, the chance of the grain boundaries extending so as to cross the gate electrode in the direction of the channel increases to a much greater extent. Accordingly, there arises a high probability of a transistor being channeled in such a direction as to cross the channel.

A heat treatment process performed during the course of the manufacturing process will now be described in consideration of the geometry of an electrode. At the time of heat treatment following patterning of a gate electrode, heat travels to the inside the gate electrode from its exposed portions (i.e., the upper surface and side walls of the electrode). For this reason, the impurity deposition layers are formed so as to have a larger thickness in the vicinity of the upper surface and side walls of the gate electrode. In a short-channel transistor whose gate length is equivalent to or smaller than the grain size of polysilicon, a local channeling phenomenon is very likely to occur.

In a large-scale integrated circuit comprising defective transistors such as those mentioned previously, a minute leakage current accounts for an increase in a standby current, which in turns hinders a reduction in the power consumption of the semiconductor device.

Direct channeling of impurities into the gate insulating film results in a deterioration in the characteristic of the insulating film or in acceleration of generation of boundary level, which in turn causes a deterioration in the reliability of the gate insulating film or of hot carriers of the transistor.

SUMMARY OF THE INVENTION

The present invention has been conceived to solve the aforementioned problems in the background art, and the object of the present invention is to provide a method of manufacturing a semiconductor device, particularly a MOS semiconductor device, whose gate electrode has a structure resistant to a channeling phenomenon at the time of ion implantation so as to lessen the degree of increase in the aspect ratio of the gate electrode which hinders the miniaturization of a semiconductor device, as well as to a semiconductor device manufactured by the method.

Another object of the present invention is to provide a semiconductor device, in which a local channeling phenomenon is prevented from occurring in a gate electrode to thereby achieve a reduction in variations in an off-leakage current, highly accurate controlling of a threshold value, and improved reliability of a gate insulating film.

According to one aspect of the present invention, in a method of manufacturing a semiconductor device, a gate insulating film is formed on a semiconductor substrate. A gate electrode is formed by deposition of semiconductor material on the gate insulating film. An amorphous layer is formed in the gate electrode. Side walls are formed on the gate electrode. Further, impurities are implanted into the semiconductor substrate by ion implantation while the gate electrode and the side walls are used as masks.

In another aspect of the present invention, in the method of manufacturing a semiconductor device, the amorphous layer is formed at least either along the top surface of, along the side surfaces of, or inside the gate electrode.

According to another aspect of the present invention, in a method of manufacturing a semiconductor device, a gate insulating film is formed on a semiconductor substrate. A gate electrode is formed so as to comprise a plurality of separated layers by deposition of semiconductor material on the gate insulating film. Side walls are formed on the gate electrode. Further, impurities are implanted into the semiconductor substrate by ion implantation while the gate electrode and the side walls are used as masks.

According to another aspect of the present invention, in a method of manufacturing a semiconductor device, gate insulating films are formed in respective regions on a semiconductor substrate having different conductivity types. Gate electrodes are formed by deposition of semiconductor material on each of the gate insulating films. Each of nitrogen-containing layers, which are different in nitrogen concentration from each other, is formed along the surface of and/or inside each of the gate electrodes so as to correspond to the conductivity types of the regions of the semiconductor substrate. Side walls are formed on each of the gate electrodes. Further, impurities are implanted into the semiconductor substrate while the gate electrodes and the side walls are used as masks.

According to still another aspect of the present invention, a semiconductor device comprises a semiconductor substrate and a gate insulating film formed on the semiconductor substrate.

A gate electrode is provided in which an amorphous layer having a grain size of 0.05 $\mu$m or less is formed along the surface of or inside the gate electrode and/or along the side surfaces of the gate electrode. Further, a conductive region is provided which is formed in the semiconductor substrate by ion implantation after formation of the amorphous layer.

Other features and advantages of the invention will be apparent from the following description taken in connection with the accompanying drawing.

BEST MODE OF CARRYING OUT THE INVENTION

Figure 1:
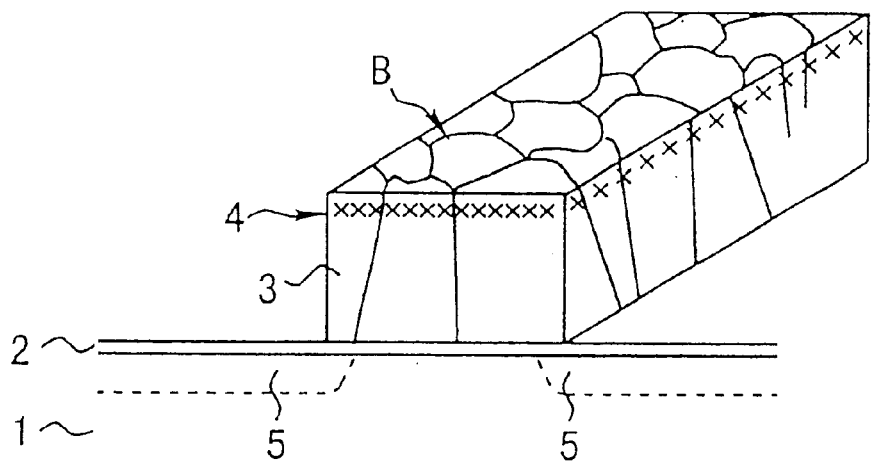
FIGS. 1 through 4 are perspective views for explaining a method of manufacturing a semiconductor device according to a first embodiment of the present invention.

With reference to the accompanying drawings, preferred embodiments of the present invention will be described herein below. The same reference numerals indicate the same or corresponding elements.

First Embodiment

FIGS. 1 through 4 are perspective views for explaining a method of manufacturing a semiconductor device according to a first embodiment of the present invention.

As shown in FIG. 1, a MOS transistor, which is a specific example of the semiconductor device, comprises a silicon semiconductor substrate 1 having a gate oxide film 2 formed thereon and a gate electrode 3 formed on the gate oxide film 2.

The gate electrode 3 is formed from semiconductor material, such as polysilicon (hereinafter abbreviated as "Poly-Si") or a silicon (hereinafter abbreviated as "$\alpha$-Si"), by deposition. An amorphous material layer 4 (hereinafter referred to as an "amorphous layer") containing a given concentration of nitrogen is formed on the gate electrode 3. From the functional viewpoint, the nitrogen-containing layer, or the amorphous layer 4, can also be referred to as an impurity-deposition or channeling inhibition layer.

As shown in the drawings, grains have already grown to a certain extent in the gate electrode 3 under normal conditions, and grain boundaries B such as those shown in the drawings are also formed in the gate electrode 3.

In the case of a MOS transistor having an LDD layer, after patterning of the gate electrode 3, ions are implanted into the semiconductor substrate 1 while the gate electrode 3 is used as a mask, whereby an LDD layer 5 is formed.

Figure 2:
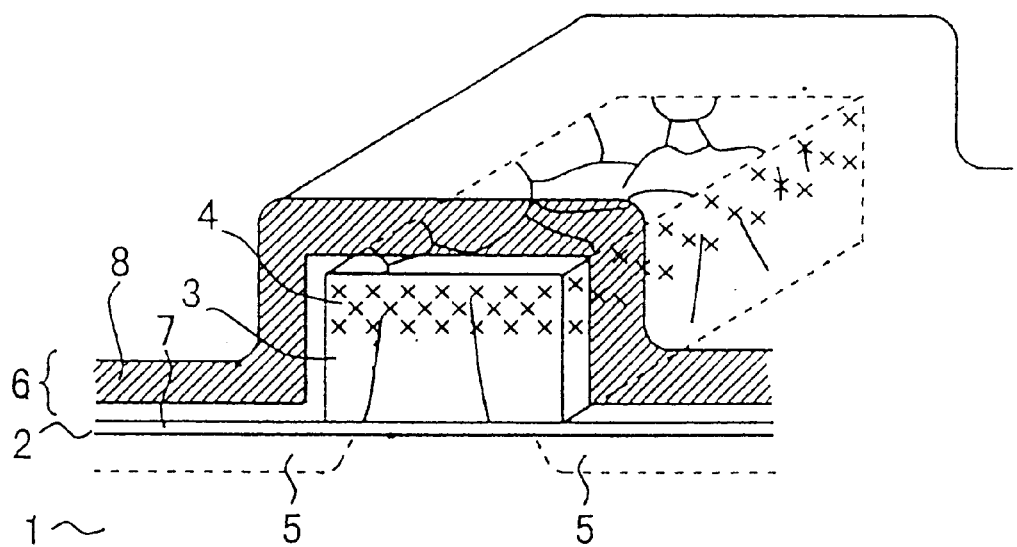

Next, as shown in FIG. 2, an insulating film 6 used for forming side walls is deposited on the gate electrode 3. The insulating film 6 has a two-layer structure comprising a TEOS insulating film 7 and a SiN film 8.

At the time of deposition of these films, heat determined by film-growth conditions is applied to the semiconductor substrate 1 (hereinafter simply referred to as a "wafer"). By way of example, an LPCVD-TEOS film is grown at temperatures ranging from 650° C. to 700° C., and an LPCVD-SiN film is grown at around 750° C.

In contrast, a Poly-Si film and an $\alpha$-Si film, both being used as a material for the gate electrode, are grown at lower temperatures; that is, the former film is grown at around 600° C, and the latter film is grown at temperatures ranging from 500° C. to 550° C. All heat treatment operations which are carried out at temperatures higher than the film-growth temperatures of the gate electrode materials (such as $\alpha$-Si and Poly-Si films) have an influence on grains of the gate electrode materials, particularly on grains of Poly-Si.

Under the existing manufacturing method, the foregoing thermal influence is great. Particularly in an $\alpha$-Si electrode or a Poly-Si electrode, either of which is doped with impurities, Poly-Si grains are increased immensely in size by heat treatment, and impurity deposition layers are formed along grain boundaries. These impurity deposition layers are attributable to the channeling phenomenon described in the background art, resulting in defective transistors.

In contrast, nitrogen contained in the amorphous layer 4 that is laid on the gate electrode 3 according to the first embodiment has an effect of preventing electrode material, particularly Poly-Si grains, from being increased immensely in size during the heat treatment carried out in later process, as well as of preventing the impurity deposition layers formed along the grain boundaries from being increased in quantity.

Figure 3:
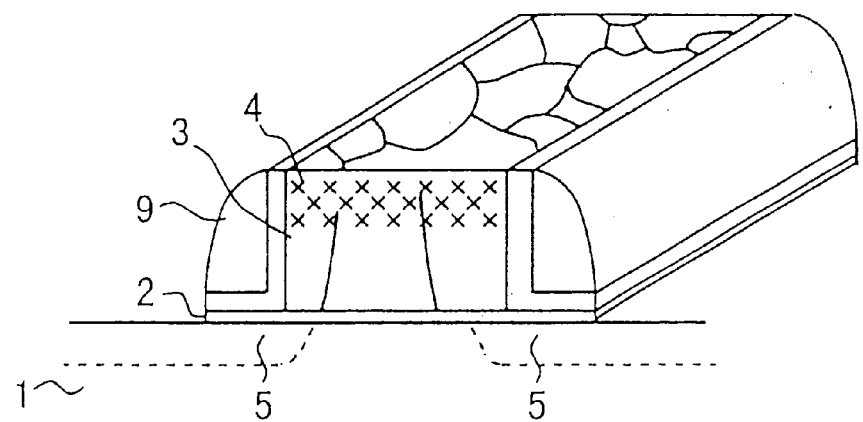
Figure 15:
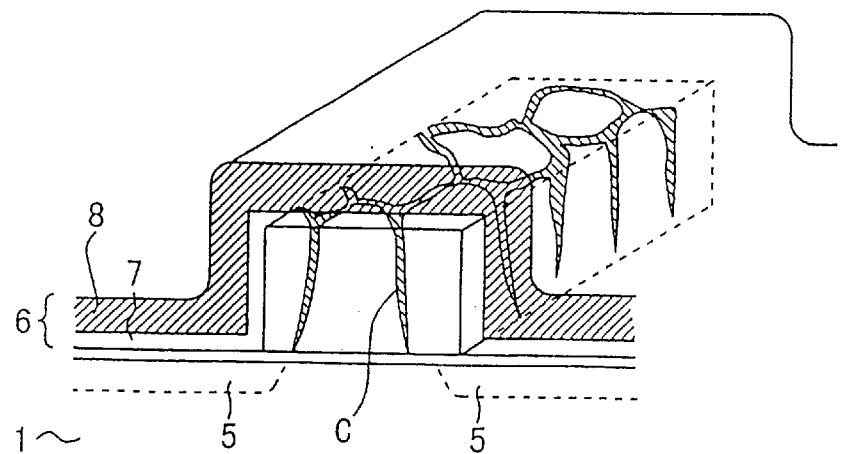
Figure 16:
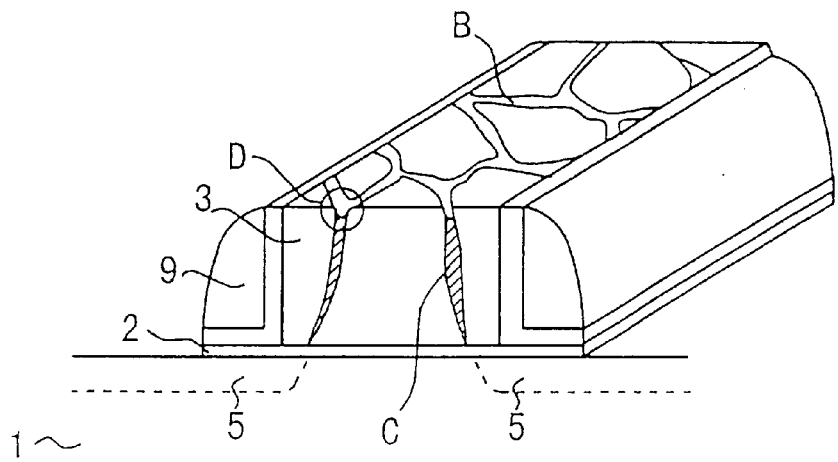

FIG. 3 shows the semiconductor device when side walls 9 are patterned by etching back the insulating film 6, wherein there is no phenomenon of local removal of the gate electrode 3 such as that occurring in the existing example shown in FIG. 15.

Figure 4:
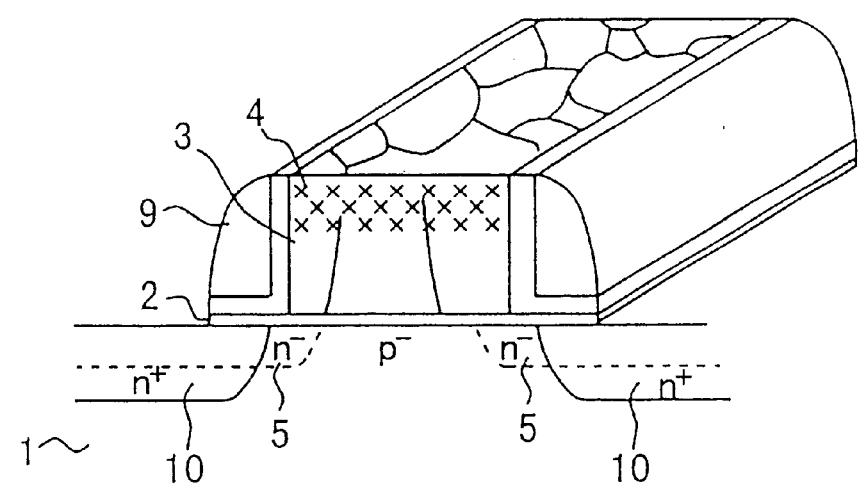
Figure 17:
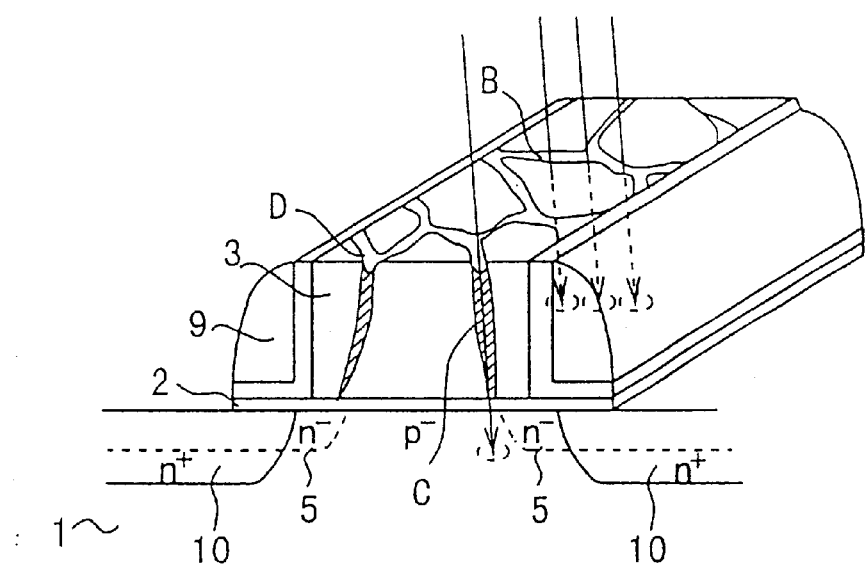

FIG. 4 shows the semiconductor device when a conductive region 10, specifically a source/drain region 10, is formed by implantation of ions of impurities into the semiconductor substrate 1 while the gate electrode 3 and the side walls 9 are used as masks. In FIG. 4, there is no local channeling phenomenon due to ion implantation such as that occurring in the existing example shown in FIG. 17.

As mentioned previously, according to the first embodiment, a transistor can be manufactured even through the processes shown in FIGS. 2 through 4 without inducing any substantial local removal or channeling phenomenon.

The first embodiment mentioned previously can be generalized by the structure in which the amorphous layer 4 is formed on the upper surface of the gate electrode 3, thereby preventing a local channeling phenomenon from occurring in the ion implantation process.

Figure 5:
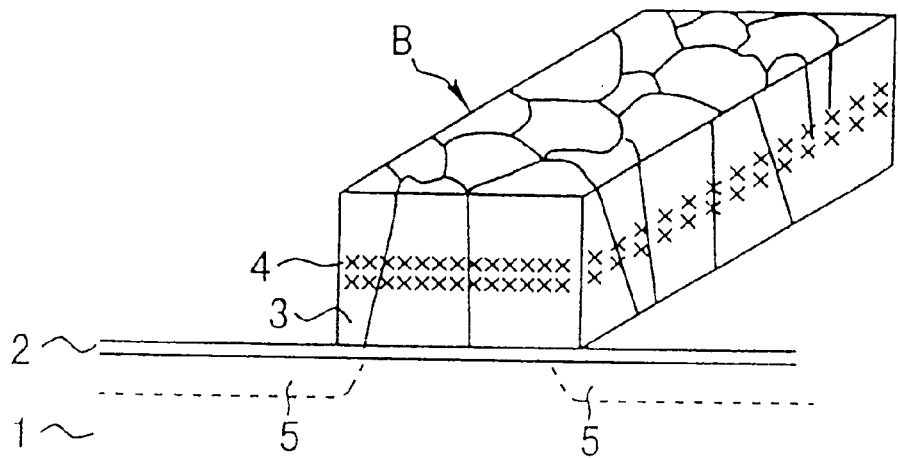
FIG. 5 is a perspective views for explaining another method of manufacturing a semiconductor device according to the first embodiment of the present invention.

Alternatively, as shown in FIG. 5, the amorphous layer 4 may be formed within the gate electrode 3 or in the middle height of the gate electrode 3.

At the time of heat treatment, the amorphous layer 4 can be referred to as an impurity deposition inhibition layer, from the functional viewpoint, which prevents an immense increase in the size of grains contained in the gate electrode material and the formation of impurity deposition layers. Further, at the time of ion implantation in which the gate electrode is used as a mask, the amorphous layer 4 can also be referred to as a channeling prevention layer or a channeling stopper layer which prevents a local channeling phenomenon.

It has been shown that forming the amorphous layer 4 to a grain size of 0.05 μm or less in the semiconductor material layer constituting the gate electrode is more effective.

The mixing of nitrogen is one method of manufacturing such an amorphous layer.

One method of mixing nitrogen into a semiconductor material is to mix nitrogen into the gate electrode in a manner such as that mentioned previously.

Another method is to in-situ deposit nitrogen by means of chemical vapor deposition (CVD). In short, a nitrogen-containing layer is deposited simultaneously with deposition of the gate electrode 3.

In the first embodiment, experimentation resulted in a discovery that desirable concentration of nitrogen in the nitrogen-containing layer is $1 \times 10^{20}$ to $1 \times 10^{22}$ atoms/cm$^3$.

The required concentration of nitrogen itself depends on the conditions for growing a Poly-Si electrode film (e.g., a film-growth temperature, a grain size, or concentrations of impurities) or on heat treatment to which the semiconductor device is subjected before undergoing ion implantation (e.g., a temperature at which or a period of time during which heat treatment is performed). Excessive mixing of nitrogen is not desirable, because it deactivates the gate electrode (e.g. an increase in the resistance of the gate electrode or generation of a depletion layer in the gate electrode). For this reason, it is desirable to impose an upper limit on the amount of nitrogen to be mixed, as well as to form the amorphous layer to the required thickness in a limited manner.

Still another method of manufacturing an amorphous layer is to mix into the gate electrode atoms which behave in the same manner as nitrogen when being bound with silicon.

Yet another method is to render the surfaces of the gate electrode 3 amorphous by oxidation of the surfaces before ion implantation.

Although the amorphous layer 4 may be formed on the surface of or in the gate electrode 3 in the foregoing description, a nitrogen-containing layer may be formed in the gate electrode 3 in parallel with the surface of the semiconductor device 1 in a manner analogous to that mentioned previously by reference to FIG. 5. In short, the gate electrode 3 may be formed to have a multilayered gate electrode structure comprising a nitrogen-containing layer and a nitrogen-free layer.

In general, the multilayered gate electrode structure has the advantage of being able to arbitrarily set the location of a nitrogen-mixed layer which deactivates dopants. For example, with a view to inhibiting a depletion layer from occurring in the gate electrode, it is desirable to sufficiently deactivate the impurities included in the vicinity of a gate insulating film. For this reason, it is desirable that a nitrogen-free α-Si or Poly-Si electrode should be formed below the gate electrode, i.e., in the vicinity of the gate insulating film, wherever possible.

In one conceivable multilayered gate structure, a nitrogen-containing layer is formed solely on the surface of the gate electrode.

A silicon layer including a high concentration of nitrogen sometimes causes an increase in sheet resistance during the silicide process. Therefore, there is also conceivable another multilayered gate structure which prevents a layer including a high concentration of nitrogen from being formed at least on the outermost surface of the gate electrode. In such a case, a nitrogen-containing layer can be formed in an intermediate position of the gate electrode 3.

In one embodiment of formation of an amorphous layer, another conceivable approach is a method under which a certain type of insulating film is deposited at the time of patterning of the gate electrode so as to cover the surface of the gate electrode at least before the semiconductor substrate is subjected to ion implantation. Even in such a case, impurity deposition layers may be formed in the Poly-Si electrode depending on the heat treatment operation carried out during the manufacturing process. For this reason, a stopper insulating film must be formed to a sufficient thickness in order to prevent a channeling phenomenon. In this regard, the method is contrary to a reduction in the aspect ratio of the gate electrode.

As mentioned previously, according to the first embodiment, an immense increase in the size of grains and the formation of impurity deposition layers are inhibited by formation of an amorphous layer in the gate electrode, thereby preventing a local channeling phenomenon due to ion implantation. As a result, there are yielded advantages of being able to form the gate electrode into a thin film; being able to reduce variations in the characteristics of the short-channel transistor; and being able to improve the reliability of the gate insulating film.

A reduction in variations in an off-leakage current and an improvement in control of a threshold value, as well as in reliability of the gate insulating film, can be achieved by preventing a local channeling phenomenon from occurring in the gate electrode.

Second Embodiment

Figure 6:
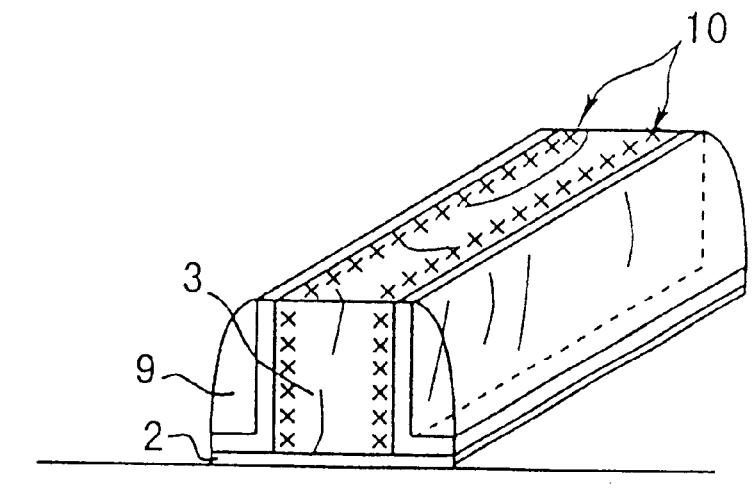
FIG. 6 is a perspective view for explaining a method of forming a gate electrode in a semiconductor device according to a second embodiment of the present invention.
Figure 7:
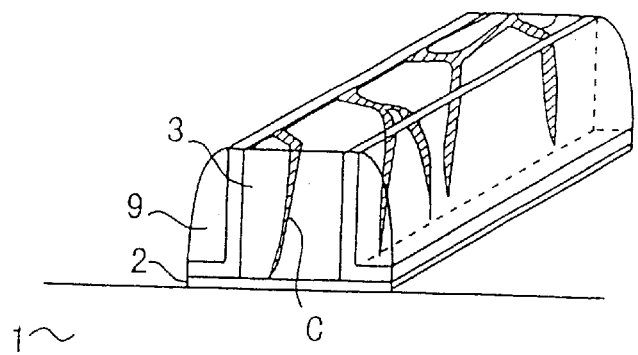
FIG. 7 is a perspective view showing an existing short-channel transistor for comparison with the semiconductor device in the second embodiment.

FIG. 6 is a perspective view for explaining a method of forming a gate electrode in a semiconductor device according to a second embodiment of the present invention, as well as for explaining the structure of the thus-formed gate electrode. FIG. 7 is a perspective view showing an existing short-channel transistor for comparison with the semiconductor device according to the second embodiment.

In the gate electrode structure for a short-channel transistor shown in FIG. 7, the width (or the gate or channel length) of the gate electrode 3 is substantially the same as the height thereof. As the gate length of the gate electrode 3 becomes shorter, exposed portions of the impurity deposition layers C in the upper surface and side walls of the electrode 3 exert a more noticeable influence on the transistor.

FIG. 6 shows the structure of the gate electrode particularly for the purpose of reducing a channeling phenomenon which occurs in the foregoing short-channel transistor at the time of ion implantation. A semiconductor material layer containing a certain concentration of nitrogen is made in the form of an amorphous layer 10 along the side surfaces of the gate electrode 3 composed of semiconductor material such as polysilicon (Poly-Si). In other respects, the gate electrode shown in FIGS. 6 and 7 is the same as that shown in FIGS. 1 through 4, and hence their overlapping explanations will be omitted here for brevity.

The existence of the nitrogen-containing layer inhibits Poly-Si grains from growing from the side walls by heat treatment during the manufacturing process in a manner analogous to that described for the first embodiment.

The second embodiment is generalized by the structure in which the amorphous layer 10 (or a layer amorphously formed) is formed along the side surfaces of the gate electrode before ions are implanted into the semiconductor substrate using the gate electrode 3 as a mask, thereby inhibiting a local channeling phenomenon from occurring in the side walls of the gate electrode. From the functional viewpoint, the amorphous layer 10 acts as a layer for inhibiting impurities from being deposited during heat treatment. The amorphous layer 10 may be referred to as a channeling prevention or stopper layer for use in ion implantation.

In the second embodiment, the side surfaces of the gate electrode 3 comprising Poly-Si are amorphously formed.

It has been shown that forming the amorphous layer 10 to a grain size of 0.05 µm or less in the semiconductor material layer constituting the gate electrode is more effective.

One method of forming an amorphous layer is to mix nitrogen into the gate electrode in a manner such as that mentioned previously.

Another method is to render the side surfaces of the gate electrode amorphous by oxidation of the surfaces before ion implantation.

A suitable method of forming a nitrogen-mixed layer in each of the side surfaces of the gate electrode 3 is to implant ions at an angle after patterning of the gate electrode.

Another method is to nitride the side surfaces of the gate electrode 3 by annealing the surfaces in a nitriding atmosphere ($NH_3$, NO, or $N_2O$).

Experimentation resulted in a discovery that desirable concentration of nitrogen in the side surfaces of the gate electrode is $1 \times 10^{20}$ to $1 \times 10^{21}$ atoms/cm$^3$. To prevent the gate electrode from being depleted, it is better to mix nitrogen into the side surfaces of the gate electrode in an amount smaller than into the upper surface of the same.

As described previously for the first embodiment, the required concentration of nitrogen itself depends on the conditions for growing a Poly-Si electrode film (e.g., a film-growth temperature, a grain size, or concentrations of impurities) or on heat treatment to which the semiconductor substrate is subjected before undergoing ion implantation (e.g., a temperature at which or a period of time during which heat treatment is performed). Excessive mixing of nitrogen is not desirable, because it deactivates the gate electrode (e.g. an increase in the resistance of the gate electrode or generation of a depletion layer in the gate electrode). For this reason, it is desirable to impose an upper limit on the amount of nitrogen to be mixed, as well as to form the amorphous layer to the required thickness in a limited manner.

The method of nitriding the side walls of the gate electrode has the advantage of inhibiting growing of grains from the side walls and generation of impurity deposition layers along the grain boundaries. In some cases, the gate length of the short-channel transistor becomes equal to or smaller than the size of Poly-Si grains. In such a case, it becomes important to inhibit impurity deposition layers from growing from both side walls of the gate electrode.

As shown in FIG. 6, as a result of the presence of nitrogen in the vicinity of the side walls of the gate electrode 3, a depletion layer occurring in the gate electrode 3 can be minimized. Further, the effective channel length of the gate electrode can also be reduced.

The foregoing method has still another advantage of improvement in the oxidation resistance of the side surfaces of the gate electrode to thereby reduce formation of bird's beak in the gate electrode at the time of oxidization. Further, by virtue of nitriding effects, particularly the reliability of edges of the gate electrode is improved. More specifically, the method has the advantage of improvement in reliability of the gate insulating film as well as in life span of hot carriers.

If an attempt is made to nitride the gate electrode after patterning, the substrate will also be nitrided at the same time. Appropriate nitriding of the surface of the substrate inhibits generation of boundary level, thereby resulting in an increase in the life span of hot carriers of the transistor. This phenomenon has also been acknowledged as an advantage of the foregoing method.

As mentioned previously, according to the second embodiment, even if, in the later process, the gate electrode is subjected to heat treatment at a temperature which is higher than that at which the gate electrode is deposited, the amorphous layer formed on the side surfaces of the gate electrode inhibits an immense increase in the size of grains and the formation of impurity deposition layers from occurring in the side surfaces of the gate electrode, thereby preventing a local channeling phenomenon from occurring when the semiconductor substrate is subjected to ion implantation before or after formation of the side walls. As a result, there are yielded advantages of being able to form the gate electrode into a thin film; being able to reduce variations in the characteristics of the short-channel transistor; and being able to improve the reliability of the gate insulating film.

Third Embodiment

Figure 8:
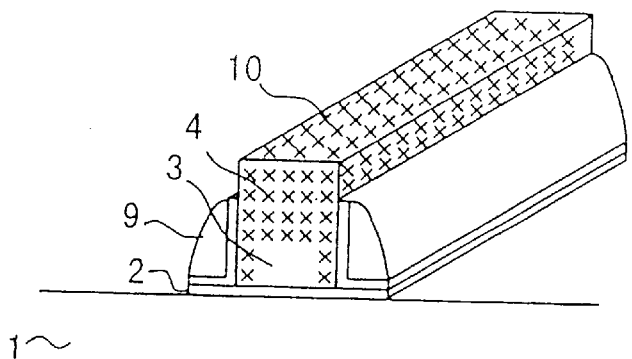
FIG. 8 is a perspective view for explaining a method of forming a gate electrode in a semiconductor device according to a third embodiment of the present invention.
Figure 9:
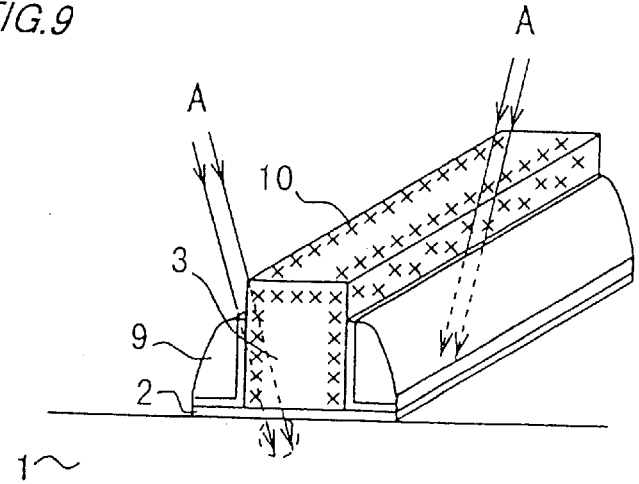
FIG. 9 is a perspective view showing an existing short-channel transistor for comparison with the semiconductor device in the third embodiment.

FIG. 8 is a perspective view for explaining a method of forming a gate electrode in a semiconductor device according to a third embodiment of the present invention, as well as for explaining the structure of the thus-formed gate electrode. FIG. 9 is a perspective view showing an existing short-channel transistor for comparison with the semiconductor device according to the third embodiment.

FIG. 9 shows the gate electrode after existing double side walls have been formed from SiN/TEOS. So long as the masking and dry etching conditions for forming side walls are controlled in the manufacturing process shown in FIG. 3, a gate electrode structure such as that shown in FIG. 9 can be obtained. It is reported that the foregoing structure has the advantage of being able to reduce the sheet resistance of a silicide gate electrode.

On the other hand, this structure has the disadvantage of being likely to cause a channeling phenomenon in a case where impurity deposition layers are formed in the gate electrode. In some cases, in spite of utilization of the effect of nitriding the upper surface of the gate electrode or the effect of nitriding the side walls of the gate electrode, the gate electrode has weak channeling resistance to ions implanted into the gate electrode in the direction denoted by arrow A shown in FIG. 9. The reason for this is that when an attempt is made to form side walls having the foregoing profile, the gate electrode is greatly cut away, resulting in a decrease in the amorphous layer which acts as a channeling inhibition layer. Further, it is impossible to increase the concentration of nitrogen in the upper surface and side walls of the gate electrode in order to prevent a reduction in the amorphous layer, because an increase in nitrogen concentration causes a depletion layer to occur in the gate electrode.

FIG. 8 shows a gate electrode structure to address the problems mentioned previously. The amorphous layers 4 and 10, which are different in nitrogen concentration from each other, are formed along the side and upper surfaces of the gate electrode 3, respectively.

The foregoing structure yields the same advantages as those described for the first and second embodiments. Further, the structure is characterized by the feature that a nitrogen-mixed layer having a high concentration of nitrogen is formed along the upper surface of the gate electrode 3 in which it is particularly desirable to inhibit formation of impurity deposition layers, and that the extent of nitriding of the side walls which are likely to cause a depletion layer to occur in the gate electrode is appropriately reduced.

The structure also has the advantage of being able to independently control the concentration of nitrogen in the side walls; that is, of being able to appropriately set the concentration of nitrogen in the semiconductor substrate 1 (i.e., a silicon substrate).

Figure 10:
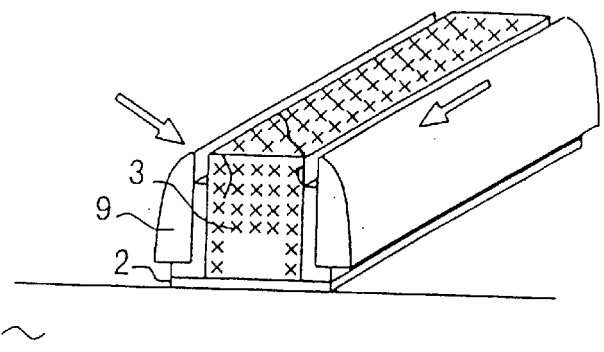
FIG. 10 shows another gate electrode structure according to the third embodiment.

FIG. 10 shows another gate electrode structure according to the third embodiment. According to the third embodiment, even in the case of a structure such as that shown in FIG. 10 in which side wall insulating films 9 adjoining the side walls of the gate electrode 3 are partially recessed, a channeling inhibition effect is achieved in a manner analogous to that mentioned previously.

The third embodiment is generalized by the structure in which an amorphous layer is formed in the upper surface of the gate electrode or inside the gate electrode as a channeling stopper layer in order to prevent a local channeling phenomenon from occurring in the ion implantation process, and by the structure in which amorphous layers (or layers formed amorphously) are formed along the side walls of the gate electrode in order to inhibit a local channeling phenomenon attributable to the side walls of the gate electrode.

It has been shown that forming the amorphous layers 4 and 10 to a grain size of 0.05 cm or less in the semiconductor material layer constituting the gate electrode is more effective.

It has been shown that it is desirable to form a layer having a concentration of $1 \times 10^{20}$ to $1 \times 10^{22}$ atoms/cm$^3$ along the upper surface of the gate electrode, as well as to form along the side surfaces of the gate electrode a layer in concentration lower than the layer formed along the upper surface; that is, a layer having a concentration of $1 \times 10^{20}$ to $1 \times 10^{22}$ atoms/cm$^{30}$.

As described previously for the first and second embodiments, the required concentration of nitrogen itself depends on the conditions for growing a Poly-Si electrode film or on heat treatment to which the semiconductor substrate is subjected before undergoing ion implantation. Excessive mixing of nitrogen is not desirable, because it deactivates the gate electrode. For this reason, it is desirable to impose an upper limit on the amount of nitrogen to be mixed, as well as to form the amorphous layer to the required thickness in a limited manner.

As mentioned previously, according to the third embodiment, nitrogen-containing layers, which are different in concentration from each other, are respectively formed along the upper surface of or inside the gate electrode, as well as along the side surfaces. As a result, an immense increase in the size of grains and the formation of impurity deposition layers are inhibited from occurring in the gate electrode, thereby preventing a local channeling phenomenon. Accordingly, there are yielded advantages of being able to form the gate electrode into a thin film; being able to reduce variations in the characteristics of the short-channel transistor; and being able to improve the reliability of the gate insulating film.

Fourth Embodiment

Figure 11:
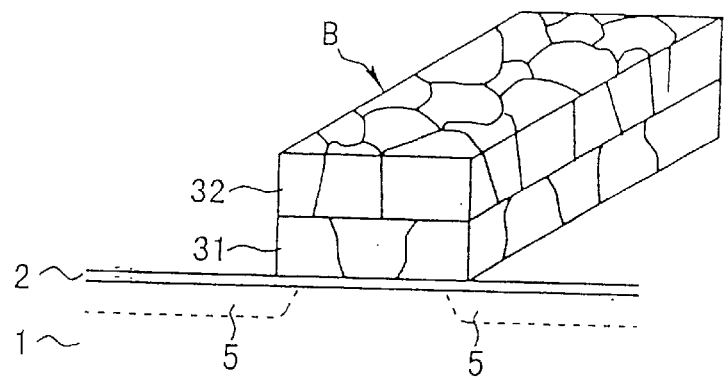
FIGS. 11 and 12 are, respectively, perspective views for explaining a method of forming a gate electrode according to a fourth embodiment of the present invention.

FIG. 11 is a perspective view for explaining a method of forming a gate electrode according to a fourth embodiment of the present invention, as well as for explaining the structure of the thus-formed gate electrode.

In general, with a view to preventing a channeling phenomenon from occurring in the impurity deposition layers of the gate electrode, a gate electrode structure which makes the grain boundaries discontinuous is conceivable. This structure is implemented as a structure such as that shown in FIG. 11. In this structure, deposition of the gate electrode 3 is temporarily suspended after a lower layer portion 31 of the gate electrode 31 has been deposited. Subsequently, an upper layer portion 32 is deposited by changing deposition conditions, as needed. In short, it is only necessary to separate the gate electrode into two segments, as well as to individually deposit the segments by temporarily interrupting growth of the Poly-Si film. The foregoing structure is intended to make the impurity deposition layers discontinuous in the heightwise direction of the gate electrode.

Figure 12:
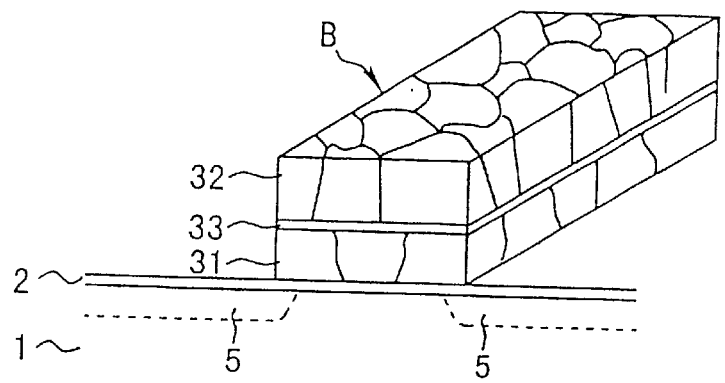

FIG. 12 is a perspective view for explaining a method of forming a gate electrode according to a fourth embodiment of the present invention, as well as for explaining the structure of the thus-formed gate electrode.

In order to forcibly make the grain boundaries formed in the gate electrode discontinuous, there is generally conceivable a structure in which a thin insulating film is sandwiched as an intermediate layer between upper and lower portions of the gate electrode. This structure is implemented as a structure such as that shown in FIG. 12. In this structure, after the lower layer portion 31 of the gate electrode 3 has been deposited, an insulating film 33 is formed while the deposition of the gate electrode is temporarily suspended. Subsequently, the a upper layer portion 32 is deposited by changing the deposition conditions, as needed.

The nitrogen-containing Poly-Si layer has the advantage of inhibiting generation of impurity deposition layers, as well as of making the grain boundaries discontinuous.

As mentioned previously, according to the fourth embodiment, after a gate insulating film has been formed on a semiconductor substrate, a gate electrode is formed so as to comprise a plurality of separated segments by deposition of semiconductor material on the gate insulating film. Alternatively, a gate electrode is formed by forming an insulating film on a deposited semiconductor material, and by depositing a semiconductor material on the insulating film. The other processes for manufacturing the foregoing structure are the same as those described for the other embodiments, and hence their overlapping explanations will be omitted here for brevity.

As described above, according to the fourth embodiment, a local channeling phenomenon due to ion implantation can be prevented by rendering the grain boundaries of gate electrode material discontinuous.

Fifth Embodiment

Next, in a dual-gate semiconductor device comprising an NMOS transistor and a PMOS transistor, the gate electrode of the PMOS transistor is more apt to be depleted. Accordingly, it is desirable to form the gate electrode of the NMOS transistor so as to become different in nitrogen concentrations from that of the PMOS transistor with a view to preventing a depletion layer from occurring in the PMOS transistor. More specifically, the concentration of nitrogen in the gate electrode of the PMOS transistor is reduced. In such a case, before the semiconductor substrate is subjected to ion implantation, the gate electrode of the PMOS transistor is masked by photolithography.

The semiconductor device mentioned previously is manufactured through the following processes. First, gate insulating films are formed in respective regions of different conductivity types (p-type and n-type) on the semiconductor substrate, thereby forming NMOS and PMOS transistors. Semiconductor material is deposited on each of the gate insulating films, forming gate electrodes. Each of nitrogen-containing layers which are different in nitrogen concentration from each other is formed along the surface of or inside the gate electrode so as to correspond to the conductivity type of region of the semiconductor substrate. In one modification of the manufacturing method, each of the nitrogen-containing layers is formed along the side surfaces of the gate electrode so as to correspond to the conductivity type of region of the semiconductor substrate. In another modification of the method, nitrogen-containing layers having different nitrogen concentrations are formed along the surface of or inside the gate electrode, as well as along the side surfaces of the same, so as to correspond to the conductivity type of region of the semiconductor substrate. Subsequently, side walls are formed on the respective gate electrodes. While the gate electrodes and side walls are used as masks, impurities are implanted into the semiconductor substrate by ion implantation, thereby forming source/drain regions.

As a result, it is possible to prevent a channeling phenomenon from occurring in the gate electrodes of the dual-gate semiconductor device, as well as to prevent a depletion layer from occurring in the gate electrode of the PMOS transistor.

According to the fifth embodiment, a dual-gate semiconductor device comprising an NMOS transistor and a PMOS transistor yields advantages analogous to those described in the other embodiments.

Sixth Embodiment

Figure 13:
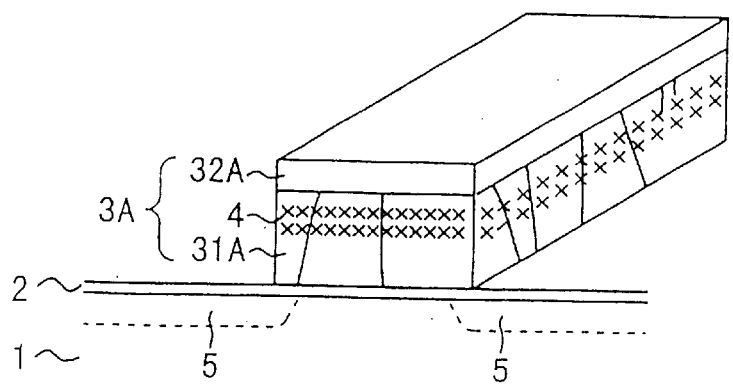
FIG. 13 is a perspective view for explaining a method of forming a gate electrode in a semiconductor device according to a sixth embodiment of the present invention.
Figure 14:
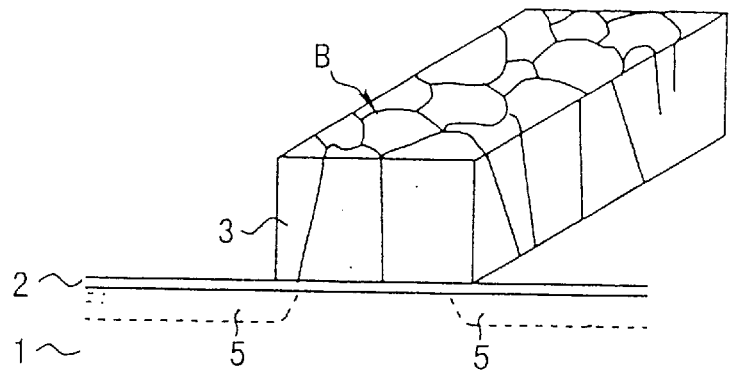
FIGS. 14 through 17 are perspective views for explaining an existing method of manufacturing a semiconductor device.

FIG. 13 is a perspective view for explaining a method of forming a gate electrode in a semiconductor device according to a sixth embodiment of the present invention, as well as for explaining the structure of the thus-formed gate electrode.

In the first through fifth embodiments, the explanation has described the semiconductor devices whose gate electrodes are formed from semiconductor material such as α-Si or Poly-Si.

In some cases, a gate electrode is formed to as to have a polycide or metal-polycide structure comprising a lower layer made of semiconductor material such as a -Si or Poly-Si, and an upper layer which is laid on the lower layer and which is formed from a metal layer or a compound layer including semiconductor material or metal. Even in such cases, deposition of impurities and a channeling phenomenon can be prevented by formation of an amorphous layer on or in a semiconductor material layer in a manner analogous to that described for the foregoing embodiments.

In the structure shown in FIG. 13, the lower layer portion 31A of the gate electrode 3A is formed from semiconductor material and the upper layer portion 32A of the gate electrode 3A is formed from metal material (e.g., tungsten, titanium, or cobalt) or from a silicide film (e.g., a tungsten silicide film) made by CVD or sputtering. Even in the case of a gate electrode such as that shown in FIG. 13, a channeling phenomenon is liable to occur in the lower layer portion of the electrode made of α-Si or Poly-Si in a manner analogous to that mentioned previously. Therefore, as shown in FIG. 13, so long as the amorphous layer 4 is formed in the semiconductor material layer, a channeling phenomenon can be inhibited, thereby enabling fabrication of semiconductor devices having identical characteristics and superior reliability. As described previously for the foregoing embodiments, the amorphous layer 4 is mixed with, e.g., a given concentration of nitrogen, and acts as an impurity deposition inhibition layer or a channeling prevention layer.

As described above, according to the sixth embodiment, even in the case of a semiconductor device having a gate electrode with a polycide or metal polycide structure, an immerse increase in the size of grains and formation of impurity deposition layers are inhibited from occurring in the gate electrode, thereby preventing a local channeling phenomenon.

The effects and advantages of the present invention may be summarized as follows.

As has been described above, according to the present invention, an amorphous layer formed in the gate electrode acts as an impurity deposition inhibition layer at the time of heat treatment, thereby inhibiting an immerse increase in the size of grains of gate electrode material and formation of impurity deposition layers from occurring. Further, in a case where the semiconductor substrate is subjected to ion implantation while the gate electrode is used as a mask, the amorphous layer acts as a channeling prevention layer and is capable of preventing a local channeling phenomenon.

Further, according to the present invention, when the semiconductor substrate is subjected to ion implantation while the gate electrode is used as a mask, a local channeling phenomenon can be prevented by rendering the grain boundaries occurred in the gate electrode discontinuous.

As a result, the gate electrode can be formed into a thin film, which in turn reduces an aspect ratio of the gate electrode. The miniaturization of the semiconductor device can be promoted.

Further, as a result of preventing a local channeling phenomenon from occurring in the gate electrode, there can be obtained a semiconductor device which realizes a reduction in variations in an off-leakage current, highly accurate controlling of a threshold value, and an improvement in reliability of the gate insulating film.

Obviously many modifications and variations of the present invention are possible in the light of the above teachings. It is therefore to be understood that within the scope of the appended claims the invention may by practiced otherwise than as specifically described.

What is claimed is:

1. A semiconductor device including a MOS transistor comprising:

a semiconductor substrate;

a gate insulating film on said semiconductor substrate;

a gate electrode;

an amorphous layer, having a grain size of 0.05 $\mu$m or less, formed on the upper surface of or within the gate electrode extending substantially parallel to the substrate;

an amorphous layer, having grain size of 0.05 $\mu$m or less, formed along the side surfaces of the gate electrode; and a conductive region which is formed in said semiconductor substrate by ion implantation after formation of said amorphous layer, wherein a semiconductor material layer having nitrogen concentration of $1\times10^{20}$–$1\times10^{22}$ atoms/cm$^3$ is provided as said amorphous layer along the surface of or inside said gate electrode, and a semiconductor material layer having a nitrogen concentration of $1\times10^{20}$–$1\times10^{21}$ atoms/cm$^3$ is provided as said amorphous layer along the side surfaces of said gate electrode.

\* \* \* \* \*